US011237731B2

(12) United States Patent
Bert (10) Patent No.: US 11,237,731 B2
(45) Date of Patent: Feb. 1, 2022

(54) QUALITY OF SERVICE FOR MEMORY DEVICES USING SUSPEND AND RESUME OF PROGRAM AND ERASE OPERATIONS

(71) Applicant: Micron Technology, Inc., Boise, ID (US)

(72) Inventor: Luca Bert, San Jose, CA (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 16/663,031

(22) Filed: Oct. 24, 2019

(65) Prior Publication Data

US 2021/0124498 A1 Apr. 29, 2021

(51) Int. Cl.
*G06F 3/06* (2006.01)
*G11C 11/409* (2006.01)
*G06F 11/07* (2006.01)

(52) U.S. Cl.
CPC .......... *G06F 3/0611* (2013.01); *G06F 3/0613* (2013.01); *G06F 3/0659* (2013.01); *G06F 3/0665* (2013.01); *G06F 3/0679* (2013.01); *G06F 11/0757* (2013.01); *G11C 11/409* (2013.01)

(58) Field of Classification Search
CPC .......... G06F 3/06; G06F 11/07; G06F 13/122; G06F 3/0611; G06F 3/0613; G06F 3/0659; G06F 3/0665; G06F 3/0679; G06F 11/0757; G11C 11/409; G05B 19/4185; G05B 19/41865; G05B 19/41885
USPC .............................................. 711/154; 710/6
See application file for complete search history.

(56) References Cited

U.S. PATENT DOCUMENTS

| | | | |
|---|---|---|---|
| 8,127,111 B1 * | 2/2012 | Wentzlaff | G06F 15/16 712/10 |
| 10,261,935 B1 | 4/2019 | Habusha et al. | |
| 10,296,230 B1 | 5/2019 | Balakrishnan et al. | |
| 2008/0181234 A1 | 7/2008 | Arndt et al. | |
| 2009/0089524 A1 | 4/2009 | Fujihara et al. | |
| 2011/0072178 A1 | 3/2011 | Mace | |
| 2011/0138106 A1 | 6/2011 | Prabhakaran et al. | |
| 2013/0198451 A1 | 8/2013 | Hyun et al. | |

(Continued)

OTHER PUBLICATIONS

PCT International Search Report and Written Opinion for International Application No. PCT/US2020/057183 dated Feb. 15, 2021, 11 pages.

(Continued)

*Primary Examiner* — Christopher B Shin
(74) *Attorney, Agent, or Firm* — Lowenstein Sandler LLP (57) ABSTRACT

A processing device in a memory system receives a request to execute a first operation of a first input/output (I/O) operation type at a memory device. The processing device further determines whether a second operation of a second I/O operation type is being executed at the memory device. Responsive to determining that the second operation is being executed, the processing device suspends the second operation after a delay time period, the delay time period corresponds to a first operation weight of the first operation and a second operation weight of the second operation, executes the first operation at the memory device, and responsive to determining that executing the first operation is complete, the processing device resumes execution of the second operation at the memory device.

20 Claims, 8 Drawing Sheets

(56) References Cited

U.S. PATENT DOCUMENTS

| | | |
|---|---|---|
| 2015/0242132 A1 | 8/2015 | Brooker |
| 2015/0287468 A1 | 10/2015 | Yet et al. |
| 2016/0188529 A1 | 6/2016 | Nagarajan et al. |
| 2016/0266928 A1 | 9/2016 | Rimoni |
| 2017/0115891 A1* | 4/2017 | O'Krafka ............. G06F 3/0604 |
| 2018/0004410 A1* | 1/2018 | Madraswala ........... G06F 3/061 |
| 2018/0081579 A1 | 3/2018 | Verrilli et al. |
| 2018/0176142 A1 | 6/2018 | Earl et al. |
| 2018/0275923 A1 | 9/2018 | Earhart et al. |
| 2019/0043593 A1 | 2/2019 | Guo et al. |
| 2019/0050261 A1 | 2/2019 | Schmisseur et al. |
| 2019/0196995 A1 | 6/2019 | Shen et al. |
| 2020/0159444 A1* | 5/2020 | Jo ......................... G06F 3/0604 |

OTHER PUBLICATIONS

PCT International Search Report and Written Opinion for International Application No. PCT/US2020/057220 dated Feb. 15, 2021, 11 pages.
PCT International Search Report and Written Opinion for International Application No. PCT/US2020/057217 dated Feb. 15, 2021, 10 pages.

* cited by examiner

QUALITY OF SERVICE FOR MEMORY DEVICES USING SUSPEND AND RESUME OF PROGRAM AND ERASE OPERATIONS

TECHNICAL FIELD

The present disclosure generally relates to a memory system, and more specifically, relates to the assignment of quality of service levels to the multiple functions in memory devices.

BACKGROUND

A memory sub-system can include one or more memory components that store data. The memory components can be, for example, non-volatile memory components and volatile memory components. In general, a host system can utilize a memory sub-system to store data at the memory components and to retrieve data from the memory components.

BRIEF DESCRIPTION OF THE DRAWINGS

The present disclosure will be understood more fully from the detailed description given below and from the accompanying drawings of various embodiments of the disclosure.

DETAILED DESCRIPTION

Aspects of the present disclosure are directed to the assignment of quality of service levels to the multiple functions in memory devices of a memory sub-system. A memory sub-system can be a storage device, a memory module, or a hybrid of a storage device and memory module. Examples of storage devices and memory modules are described below in conjunction with FIG. 1. In general, a host system can utilize a memory sub-system that includes one or more memory components, such as memory devices that store data. The host system can provide data to be stored at the memory sub-system and can request data to be retrieved from the memory sub-system.

The evolution of server architecture and the availability of multi-core processors has encouraged significant changes to server design. Most notably, servers running a single operating system (OS) have been replaced by multi-tenants servers, where a number of "owners" (e.g., guest operating systems running in virtual machines (VMs), containers, or microservices) share the same physical server platform, unaware of the existence of each other.

Connecting input/output (I/O) devices to each VM can be problematic and resource intensive, so special architectures have evolved to simplify the connection process and maximize performance. Certain conventional memory-subsystems utilize the single root input/output virtualization (SR-IOV) specification. SR-IOV is a specification that allows the isolation of peripheral component interconnect (PCI) Express (PCIe) resources among various hardware functions for manageability and performance reasons, while also allowing single physical PCIe devices to be shared in a virtual environment. SR-IOV offers different virtual functions (VFs) to different virtual components (e.g., a network adapter) on a physical server machine. SR-IOV also allows different virtual machines in a virtual environment to share a single PCIe hardware interface. Alternatively, an equivalent capability can be offered by a number of parallel Physical Functions, called "Multi-PF." The Multi-PF architecture maps each physical function (PF) to a VM. A physical function allows enumeration of a number of physical functions and a hypervisor can then assign those physical functions to one or more virtual machines. These solutions require both a Host OS in charge of doing enumeration and resource assignment, and a set of Guest OSs, running on virtual machines, which will be in charge of the regular data flow. The Host OS can be aware of such capabilities and identify special functions to be added to the Host OS. In addition, most hypervisor environments do not support SR-IOV, making that solution inapplicable to many situations. Furthermore, in many circumstances, each VM can have a Service Level Agreement (SLA) defining a certain level of service, including quality, availability, responsibilities, etc. that is to be provided. In certain circumstances, meeting the SLA of the memory sub-system can be challenging when each VF and/or PF is expected to provide the same level of quality of service.

Aspects of the present disclosure address the above and other deficiencies by having a memory sub-system that provides a mechanism so that each function (VF and/or PF) can be serviced at a different Quality of Service (QoS) level so as to meet the conditions of the system SLA. When providing such QoS levels in a memory sub-system utilizing NAND-based memory and similar devices, there are certain considerations to address. For example, NAND writes (programs) are slow and asynchronous and can interfere with incoming system IOs, potentially impacting the QoS. In addition, on NAND devices, data is often moved around as part of wear leveling operations and conflicts with incoming data are generally unpredictable. Also, the memory sub-system can perform certain background operations (e.g., garbage collection, media scans, wear leveling) that may impact I/O on unpredictable levels. NAND erase and program operations are both high impact operations, as they lock down the entire die when active, and are also very slow (e.g., 10×-30× slower than reads) so IOs that impact such die can be considerably delayed. Furthermore, NAND erase and program operations have a suspend/resume capability, but that will impact all other IOs. Therefore, a scheme can be utilized to prioritize the various functions as well as the different types of I/O and background operations of each function in order to support a predictable QoS of the memory sub-system.

In one implementation, the memory sub-system defines a function weight representing a quality of service level assigned to each function in the memory sub-system. The memory sub-system can further define a certain operation weight for read type operations and a different operation weight for write type operations received at the function, such that different QoS capabilities can be assigned to read versus write operations. The memory sub-system can also define a policy for program/erase (P/E) suspend and resume operations that incorporates the operation weight of the P/E operation as well as the operation weight of a waiting operation (i.e., a subsequent operation to be performed), as explained in more details herein below.

The assignment of quality of service levels to multiple functions techniques described herein allow a memory sub-system to provide a different level of quality of service (QoS) to each function (VF or PF) of the memory sub-system by providing function wright, operation weight, and suspend/resume policy features. The use of function weight assigned to each function allows for a more predictable QoS level from each function because each function can have a predictable processing time that is based on its function weight. The function weight of each function can also provide a more deterministic latency of the function as the memory sub-system can adjust the latency of each function to be relative to its function weight (e.g. the higher the function weight the lower its average latency). Further, by assigning operation weights to each I/O operation type, the memory sub-system can prioritize the fast I/O operations (e.g. read operations) over the slow I/O operations (e.g. write operations) such that the fast operations are not excessively delayed due to the execution of numerous lengthy operations. Furthermore, the ability to suspend lengthy operations in order to execute fast I/O operations after a calculated delay of time can provide for a more predictable impact of background operations (erase, garbage collection, wear leveling, etc.) on the execution time of I/O operations. In this manner, the significant delay the can impact I/O operations due to the execution of background operations can be reduced and further predicted based on the suspend/erase policy of the memory sub-system that can define how to handle I/O operations arriving at the memory device while a background operation is being executed. Additional details of these techniques are provided below with respect to FIGS. 1-7.

Figure 1:
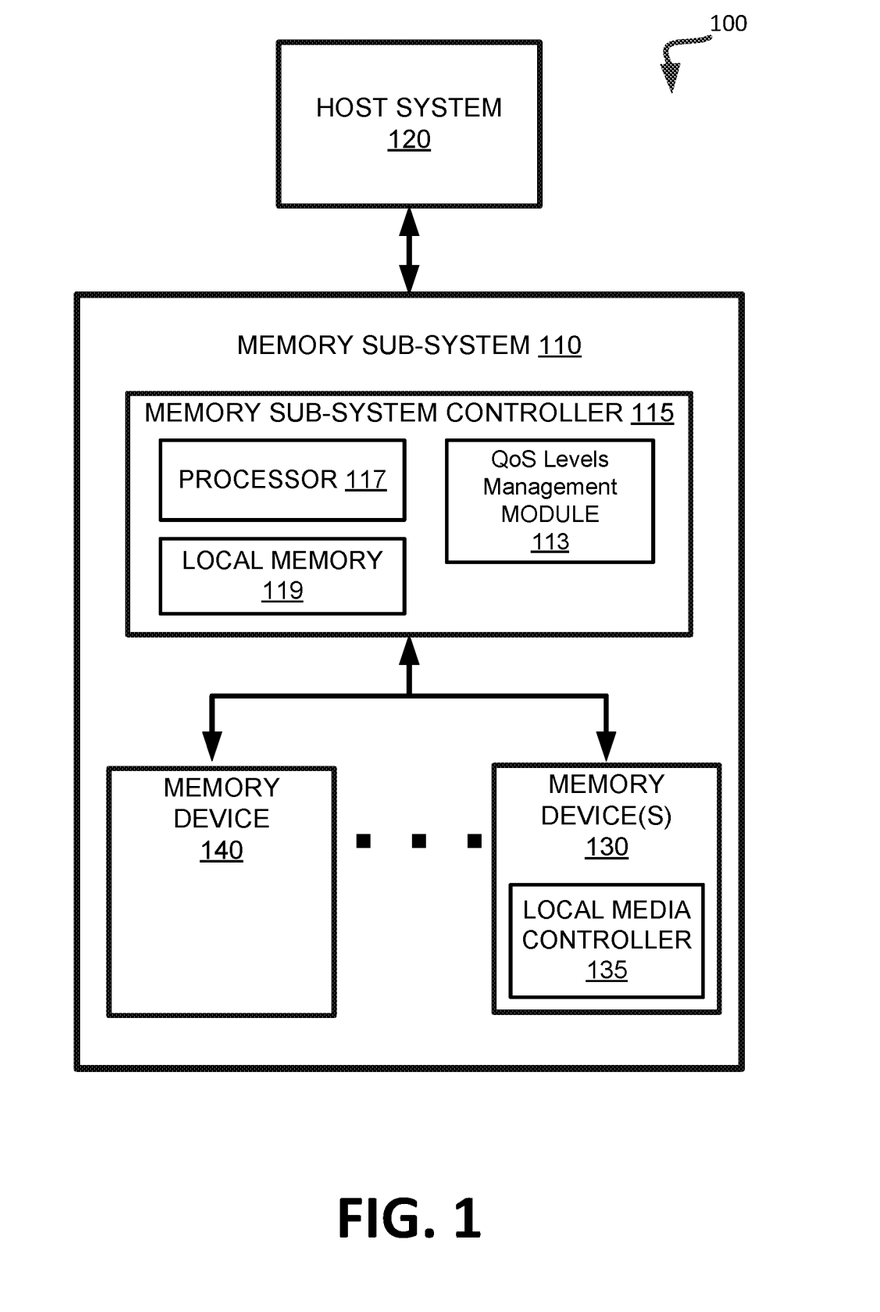
FIG. 1 illustrates an example computing environment for the assignment of quality of service levels to the multiple functions in memory devices, in accordance with some embodiments of the present disclosure.

FIG. 1 illustrates an example computing environment 100 that includes a memory sub-system 110 in accordance with some embodiments of the present disclosure. The memory sub-system 110 can include media, such as one or more volatile memory devices (e.g., memory device 140), one or more non-volatile memory devices (e.g., memory device 130), or a combination of such.

A memory sub-system 110 can be a storage device, a memory module, or a hybrid of a storage device and memory module. Examples of a storage device include a solid-state drive (SSD), a flash drive, a universal serial bus (USB) flash drive, an embedded Multi-Media Controller (eMMC) drive, a Universal Flash Storage (UFS) drive, and a hard disk drive (HDD). Examples of memory modules include a dual in-line memory module (DIMM), a small outline DIMM (SO-DIMM), and a non-volatile dual in-line memory module (NVDIMM).

The computing environment 100 can include a host system 120 that is coupled to one or more memory sub-systems 110. In some embodiments, the host system 120 is coupled to different types of memory sub-system 110. FIG. 1 illustrates one example of a host system 120 coupled to one memory sub-system 110. The host system 120 uses the memory sub-system 110, for example, to write data to the memory sub-system 110 and read data from the memory sub-system 110. As used herein, "coupled to" generally refers to a connection between components, which can be an indirect communicative connection or direct communicative connection (e.g., without intervening components), whether wired or wireless, including connections such as electrical, optical, magnetic, etc.

The host system 120 can be a computing device such as a desktop computer, laptop computer, network server, mobile device, embedded computer (e.g., one included in a vehicle, industrial equipment, or a networked commercial device), or such computing device that includes a memory and a processing device. The host system 120 can be coupled to the memory sub-system 110 via a physical host interface. Examples of a physical host interface include, but are not limited to, a serial advanced technology attachment (SATA) interface, a peripheral component interconnect express (PCIe) interface, universal serial bus (USB) interface, Fibre Channel, Serial Attached SCSI (SAS), etc. The physical host interface can be used to transmit data between the host system 120 and the memory sub-system 110. The host system 120 can further utilize an NVM Express (NVMe) interface to access the memory components (e.g., memory devices 130) when the memory sub-system 110 is coupled with the host system 120 by the PCIe interface. The physical host interface can provide an interface for passing control, address, data, and other signals between the memory sub-system 110 and the host system 120.

The memory devices can include any combination of the different types of non-volatile memory devices and/or volatile memory devices. The volatile memory devices (e.g., memory device 140) can be, but are not limited to, random access memory (RAM), such as dynamic random access memory (DRAM) and synchronous dynamic random access memory (SDRAM).

Some examples of non-volatile memory devices (e.g., memory device 130) include negative-and (NAND) type flash memory and write-in-place memory, such as three-dimensional cross-point ("3D cross-point") memory. A 3D cross-point memory device is a cross-point array of non-volatile memory cells that can perform bit storage based on a change of bulk resistance, in conjunction with a stackable cross-gridded data access array. Additionally, in contrast to many flash-based memories, cross-point non-volatile memory can perform a write-in-place operation, where a non-volatile memory cell can be programmed without the non-volatile memory cell being previously erased.

Each of the memory devices 130 can include one or more arrays of memory cells such as single level cells (SLCs), multi-level cells (MLCs), triple level cells (TLCs), or quad-level cells (QLCs). In some embodiments, a particular memory component can include an SLC portion, and an MLC portion, a TLC portion, or a QLC portion of memory cells. Each of the memory cells can store one or more bits of data used by the host system 120. Furthermore, the memory cells of the memory devices 130 can be grouped to form pages that can refer to a unit of the memory component used to store data. With some types of memory (e.g., NAND), pages can be grouped to form blocks. Some types of memory, such as 3D cross-point, can group pages across die and channels to form management units (MUs).

Although non-volatile memory components such as NAND type flash memory and 3D cross-point are described, the memory device 130 can be based on any other type of non-volatile memory, such as read-only memory (ROM), phase change memory (PCM), magneto random access memory (MRAM), negative-or (NOR) flash memory, electrically erasable programmable read-only memory (EEPROM).

The memory sub-system controller 115 can communicate with the memory devices 130 to perform operations such as reading data, writing data, or erasing data at the memory devices 130 and other such operations. The memory sub-system controller 115 can include hardware such as one or more integrated circuits and/or discrete components, a buffer memory, or a combination thereof. The hardware can include a digital circuitry with dedicated (i.e., hard-coded) logic to perform the operations described herein. The memory sub-system controller 115 can be a microcontroller, special purpose logic circuitry (e.g., a field programmable gate array (FPGA), an application specific integrated circuit (ASIC), etc.), or other suitable processor.

The memory sub-system controller 115 can include a processor (processing device) 117 configured to execute instructions stored in local memory 119. In the illustrated example, the local memory 119 of the memory sub-system controller 115 includes an embedded memory configured to store instructions for performing various processes, operations, logic flows, and routines that control operation of the memory sub-system 110, including handling communications between the memory sub-system 110 and the host system 120.

In some embodiments, the local memory 119 can include memory registers storing memory pointers, fetched data, etc. The local memory 119 can also include read-only memory (ROM) for storing micro-code. While the example memory sub-system 110 in FIG. 1 has been illustrated as including the memory sub-system controller 115, in another embodiment of the present disclosure, a memory sub-system 110 may not include a memory sub-system controller 115, and may instead rely upon external control (e.g., provided by an external host, or by a processor or controller separate from the memory sub-system).

In general, the memory sub-system controller 115 can receive commands or operations from the host system 120 and can convert the commands or operations into instructions or appropriate commands to achieve the desired access to the memory devices 130. The memory sub-system controller 115 can be responsible for other operations such as wear leveling operations, garbage collection operations, error detection and error-correcting code (ECC) operations, encryption operations, caching operations, and address translations between a logical block address and a physical block address that are associated with the memory devices 130. The memory sub-system controller 115 can further include host interface circuitry to communicate with the host system 120 via the physical host interface. The host interface circuitry can convert the commands received from the host system into command instructions to access the memory devices 130 as well as convert responses associated with the memory devices 130 into information for the host system 120.

The memory sub-system 110 can also include additional circuitry or components that are not illustrated. In some embodiments, the memory sub-system 110 can include a cache or buffer (e.g., DRAM) and address circuitry (e.g., a row decoder and a column decoder) that can receive an address from the memory sub-system controller 115 and decode the address to access the memory devices 130.

In some embodiments, the memory devices 130 include local media controllers 135 that operate in conjunction with memory sub-system controller 115 to execute operations on one or more memory cells of the memory devices 130. In some embodiments, the memory devices 130 are managed memory devices, which is a raw memory device combined with a local controller (e.g., local controller 135) for memory management within the same memory device package. An example of a managed memory device is a managed NAND (MNAND) device.

The memory sub-system 110 includes QoS levels management module 113 that can be used to assign a QoS level to each function in the memory sub-system. In certain implementation, QoS levels management module 113 can assign to each function of the multiple functions provided by the memory sub-system, a corresponding function weight representing a level of QoS associated with the function. In one implementation, the function weight can be a value relative to the average latency of the memory device such that, for example, a given function can be served at a lower latency than the average latency of the memory device (thus providing a high level of QoS). In another example, the function weight of another function can indicate that the other function can be served at a higher latency rate than the average latency of the memory device (thus providing a low level of QoS). In certain implementations, the level of quality of service associated with a function can be configured and adjusted via parameters including input/output operations per second (IOPS) received at the function and a throughput dedicated to the function. The memory sub-system can configure these parameters, thus modifying the level of QoS, by setting a minimum (i.e., "Reserve") and a maximum (i.e., "Limit") to each parameter.

QoS levels management module 113 can then service each function based on the corresponding function weight assigned to the function as well as operation weights assigned to each I/O operation type of operations received at the function. In implementations, QoS levels management module 113 can assign a first operation weight to the read type operations of the function and a second operation weight to the write type operations of the function. The function weight and operation weights can then be used together to determine the number of operations of each type that can be executed per one unit of time. For example, the function weight assigned to a given function can translate to a number of I/O operations that can be executed per one unit of time. The number of operations can be a subset of the I/O operations received at the function. Additionally, the first operation weight can indicate how many of the number of operations can be assigned to the read type operations and the second operation weight can indicate how many of the number of operations can be assigned to the write type operations.

When an operation is selected for execution, QoS levels management module 113 further support the level of QoS assigned to the operation (e.g. in the form of an operation weight) by executing a suspend/resume policy according to the operation weight of the operation. In some implementations, when a read operation is received at the memory device for execution, QoS levels management module 113 can check whether a write operation is currently being executed by the memory device. If so, QoS levels management module 113 can suspend the write operation after a calculated delay time period that is proportionate to the operation weight of the read operation and the operation weight of the write operation. The higher the ratio of the operation weight of the read operation to the operation weight of the write operation the longer the delay time period can be. After the delay time period elapses, QoS levels management module 113 can execute the read operation and then when the read operation is complete, resume the write operation. Further details with regards to the operations of QoS levels management module 113 are described below.

Figure 2:
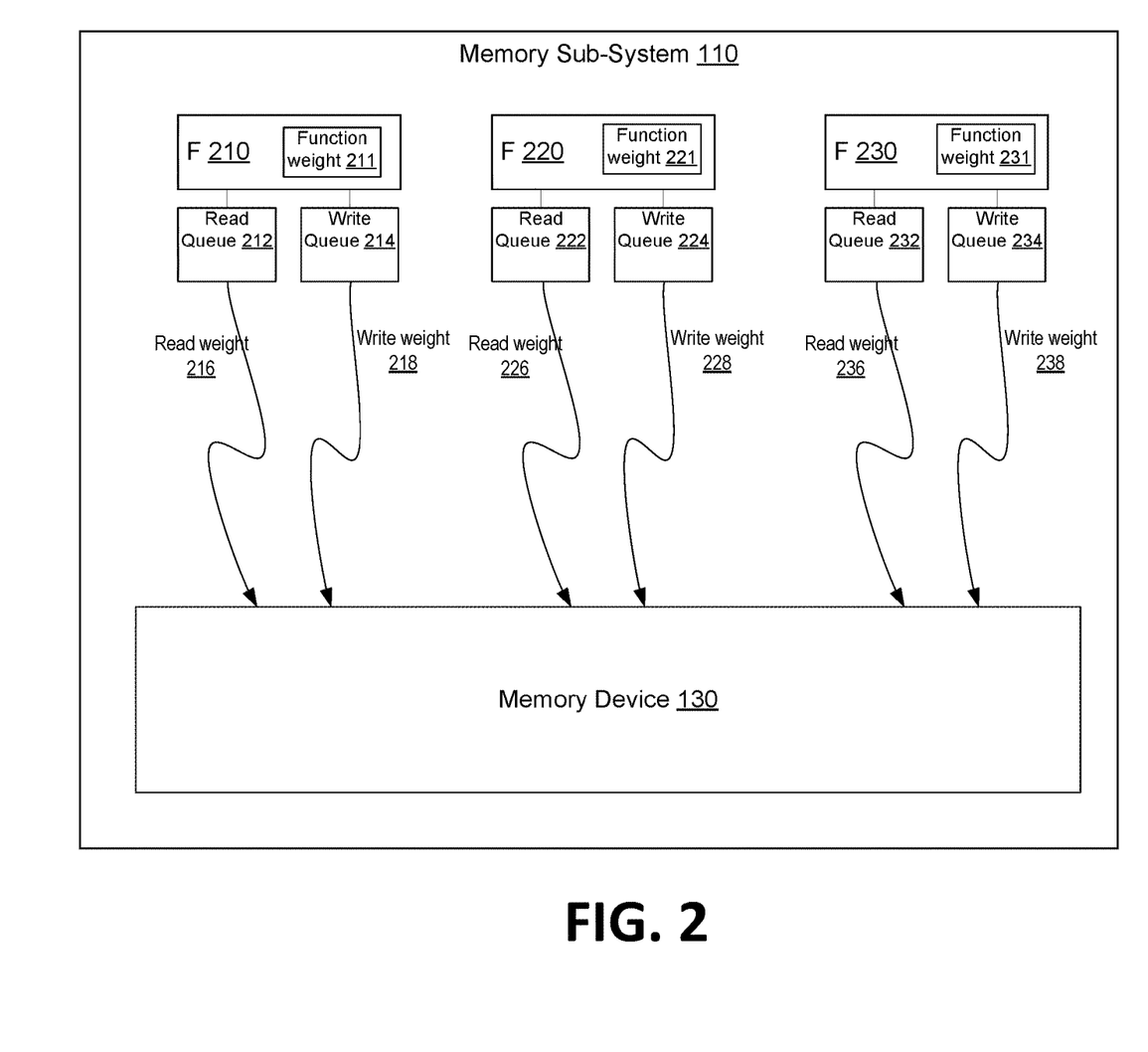
FIG. 2 illustrates function weight and operation weight assignment in memory sub-system 110 for quality of service (QoS) levels management, in accordance with some embodiments of the present disclosure.

FIG. 2 illustrates function weight and operation weight assignment in memory sub-system 110 for quality of service levels management in accordance with some embodiments of the present disclosure. Memory sub-system 110 can provide multiple virtual and physical functions F 210-230 for accessing memory device 130. In certain implementations, memory sub-system 110 provides multiple functions in order to serve multiple virtual machines (VMs) in a virtualized environment, with each VM utilizing one or more function to access memory device 130. Functions F 210-230 can receive I/O operations (e.g. read operations, write operations) from the host computing system for accessing memory device 130. Since all of these I/O operations from the various functions need to access memory device 130, and since functions can vary in the level of QoS assigned to it by memory sub-system 110, each function can have a different priority for accessing memory device 130 that is consistent with its QoS level. The priority of each function can be represented by function weights 211-231. Further, for a given function, each operation type (e.g. read operation type, write operation type) can have a different priority for accessing memory device 130, which can be expressed as read weights 216-236 and write weights 218-238.

Memory sub-system 110 can assign to each function 210-230 a corresponding function weight representing a level of quality of service associated with the function. For example, F 210 can be assigned a function weight 211, F 220 can be assigned a function weight 221, and F 230 can be assigned a function weight 231. In one implementation, the function weight can be a value relative to the average latency of memory device 130. The average latency of memory device 130 can refer to the average duration of time between the time an I/O operation has been received to the time the execution of the I/O operation has been completed. In implementations, the average latency can be calculated using timers for measuring the timing of read operations that have been services in one unit of time (e.g. one second), and the timing of write operations that have been serviced in the same unit of time. The average read latency of memory device 130 can then be calculated as the average of the measured times of the read operations. The average write latency of memory device 130 can be calculated as the average of the measured times of the write operations. The total average latency of memory device 130 can also be determined in terms of the average read latency and the average write latency.

Given the average latency of memory device 130, function weights 211-231 can be determined relative to the average latency of memory device 130. In one implementation, function weight can be a value between 0 and 1000. 0 can indicate lowest possible latency and 1000 can indicate 10× longer than the average latency of memory device 130. Intermediate values between 0 and 1000 can indicate a corresponding percentage of the average latency of memory device 130. For example, if function weight 211 equals 50, it indicates that F 210 should be serviced with latency that is twice as fast as the average latency of memory device 130 (i.e. 0.5×average latency), thus providing a higher than average level of QoS. On the other hand, if function weight 221 equals 500, it indicates that F 220 should be serviced with latency that is five times as slow as the average latency of memory device 130 (i.e. 5× average latency), thus providing a lower than average level of QoS. In certain implementations, function weight can be translated to a number of I/O operations received at the function that can be executed in a given execution cycle. In an illustrative example, if memory device 130 is able to process 12 operations during an execution cycle, the 12 operations can be divided among functions according to the weight of each function relative to the weights of the other functions. Thus if function weight 211 is 50, function weight 221 is 500, and function weight 231 is 150, then the 12 operations per cycle can be assigned as 8 operations to function F 210, 3 operations to F 220, and 1 operation to F 230 during each execution cycle. Memory sub-system 110 can then determine how many of the operations assigned to each function can be read type operation versus write type operations based on the operation weight of each type.

Read weights 216-236 can determine the priority of the read operations received at the respective function, in relation to the priority of the corresponding write operations received at the same function. The priority of operation types can facilitate a more predictable QoS of the function because it can allow fast operations to be prioritized over time-consuming operations, for example, which can further eliminate the random order of processing of operations of different types. In an illustrative example, if read weight 216 is 3 and write weight is 1, then, following the example above, if F 210 is assigned 8 operations per execution cycle, the 8 operations can be apportioned 3:1 between read operations and write operations respectively. Thus, the 8 operations can be allocated as 6 operations of read type operations and 2 operations of write type operations. In implementations, the 6 read operations can be retrieved from read queue 212 and the two write operations can be retrieved from write queue 214.

Read queues 212-232 are operation queues for storing read operations received at functions 210-230. Write queues 214-234 are operation queues for storing write operations received at function 210-230. While read queues 212-232 and write queues 214-234 are shown as one read queue and one write queue per function, each function can have its own one or more read queues and one or more write queues for storing I/O operations received at the function. The I/O operations are stored in a given queue according to the operation type (e.g. read versus write). The I/O operations can be stored in the queues until they are retrieved for execution during one or more execution cycles. During an execution cycle, read operations can be retrieved from a read queue 212-232 of function 210-230 according to the function a read weight 216-236 and a function weight 211-231. Similarly, write operations can be retrieved from a write queue 214-234 of function 210-230 according to the function a write weight 218-238 and a function weight 211-231. For example, if F 220 has a function weight 221 of 3, a read weight 226 of 2, and a write weight 228 of 1, then memory sub-system 110 can retrieve 2 read operations from read queue 226 and 1 write operation from write queue 228 when processing I/O operations from function 230. In implementations, if write queue 228 does not contain I/O operations then memory sub-system 110 can retrieve all 3 operations from the read queue 226 if available. Similarly, if read queue 226 does not contain I/O operations then memory sub-system 110 can retrieve all 3 operations from the write queue 228 for processing if available.

Figure 3:
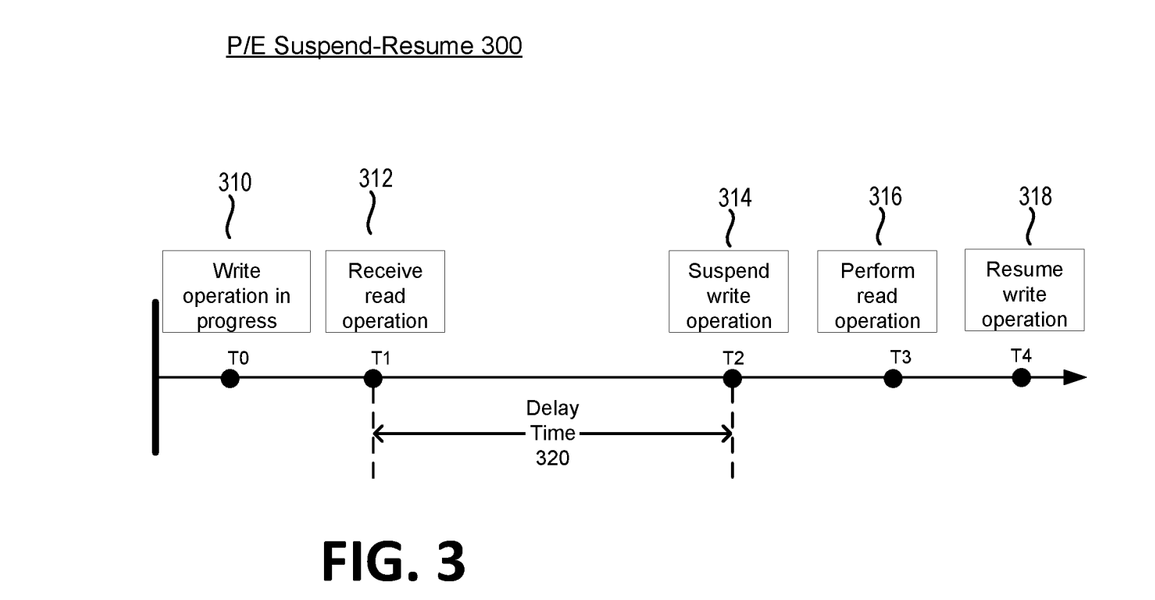
FIG. 3 illustrates an example of a program/erase (P/E) suspend/resume policy timeline in support of QoS levels management, in accordance with some embodiments of the present disclosure.

FIG. 3 illustrates an example of a program/erase (P/E) suspend/resume policy timeline in support of QoS levels management, in accordance with some embodiments of the present disclosure. A P/E suspend/resume policy can prioritize certain types of I/O operations over a currently executing operation of another operation type, as explained below. When an operation is selected for execution, memory sub-system 110 can further support the level of QoS assigned to the operation (e.g. in the form of an operation weight) by executing a policy of suspend and resume according to the operation weight of the operation.

At block 310, a write operation can be executing at memory device 130 at time T0. The write operation can have an assigned write weight indicating the priority of the write operation. In implementations, the write weight can be a function of the operation weight of the write operation and the function weight of the function where the write operation was received. In other implementations, the write weight can be a function of a level of quality of service assigned to the write type operations (e.g. a certain bandwidth value assigned to write type operations). At block 312, a read operation can be arrive at memory device 130 at time T1. The read operation can have an assigned read weight indicating the priority of the read operation. In implementations, the read weight can be a function of the operation weight of the read operation and the function weight of the function where the read operation was received. In other implementations, the read weight can be a function of a level of quality if service assigned to the read type operations (e.g. a certain bandwidth value assigned to read type operations).

In some implementations, when a read operation is received at memory device 130 while a write operation is being executed, memory sub-system 110 can suspend the write operation after a calculated delay time 320, in order to execute the read operation. This is done to enable the fast read operation to execute without having to wait for a lengthy write operation to fully complete execution, as explained above.

Delay time 320 corresponds to the operation weight of the incoming read operation and the operation weight of the write operation in progress, such that the higher the ratio of the operation weight or the read operation to the operation weight of the write operation the longer the delay time period can be. Delay time 320 can provide a way to execute high priority read operations while allowing the write operation to complete with minimum number of suspend/resume interruptions as more read operations arrive for execution. Further, delay time 320 can be defined as increments of a predetermined period of time Tr. Tr can be defined as the average read time of memory device 130 (e.g. 100 milliseconds). For example, if the operation weight of the write operation is defined as 200 and the operation weight of the read operation is 50, then the ratio of the read weight to the write weight is 1:4, meaning that delay time 320 can be ¼ (one fourth)×Tr. If, on the other hand, the operation weight of the write operation is 300 instead of 200, then the ratio is 1/6, meaning the write operation is even lower priority compared to the read operation, then the read operation can wait for only ⅙ (one sixth)×Tr before executing, and so on.

After the delay time period elapses, at block 314, memory sub-system 110 suspend the write operation at T2. When the suspend operation completes, the memory sub-system 110 can execute the read operation at block 316, by allowing the operation to access memory device 130 at T3. Subsequently, when the read operation completes, memory sub-system can resume the suspended write operation at block 318. In implementations, the suspend/resume policy explained herein can also apply when a background operation (e.g. erase) is being executed at memory device 130 and a read operation arrives at memory device 130 for execution.

Figure 4:
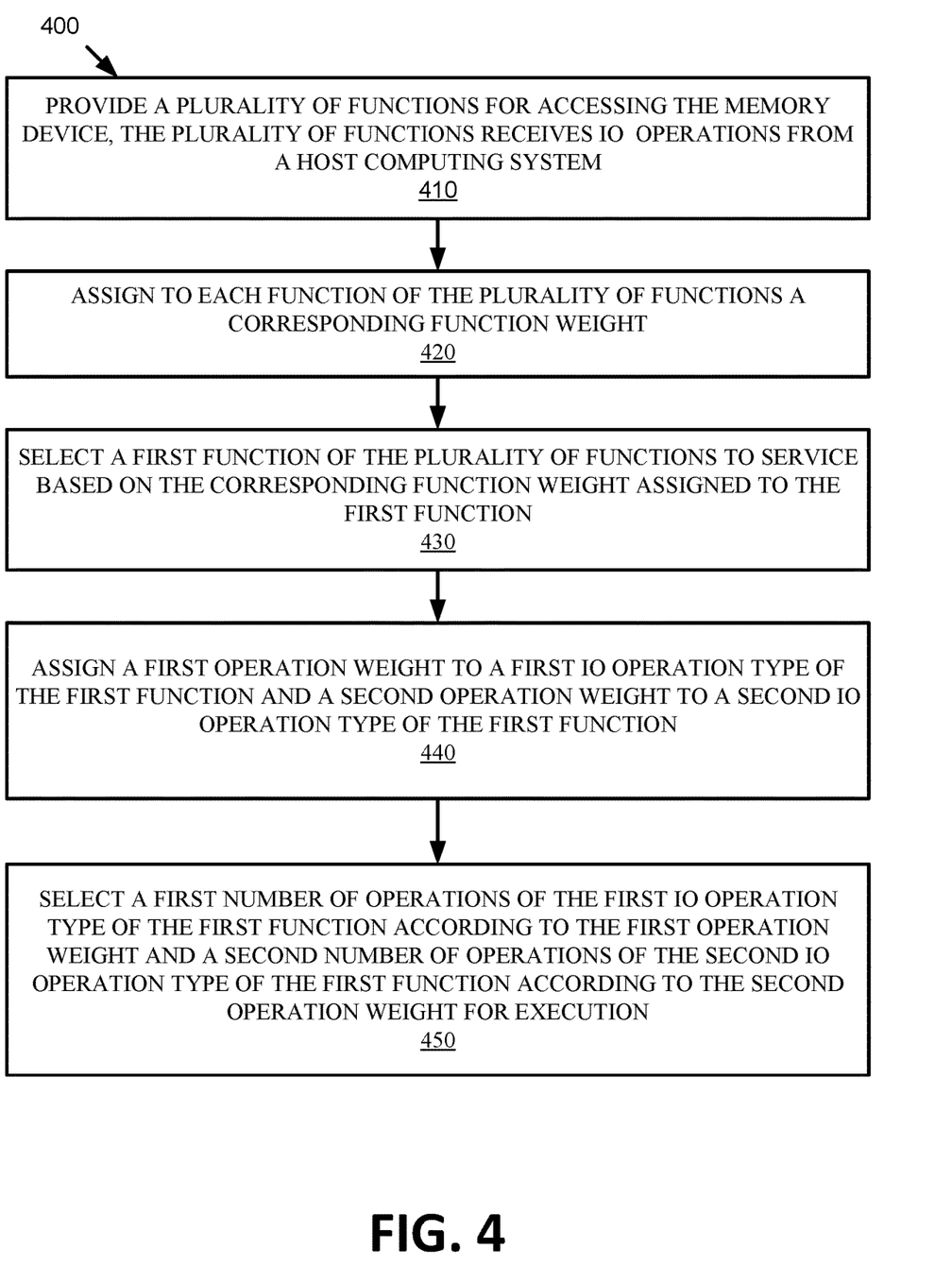
FIG. 4 is a flow diagram of an example method of assigning function weights and operation weights in support of QoS levels management in a memory sub-system, in accordance with some embodiments of the present disclosure.

FIG. 4 is a flow diagram of an example method of assigning function weights and operation weights in support of QoS levels management in a memory sub-system, in accordance with some embodiments of the present disclosure. The method 400 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 400 is performed by QoS levels management module 113 of FIG. 1. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

At operation 410, the processing logic provides a plurality of functions for accessing memory device 130. The plurality of function receives I/O operations from a host computing system for processing, as explained in more details herein above. The plurality of function can be virtual functions and/or physical functions that can receive read operations and write operations of the memory device 130. At operation 420, the processing logic can assign to each function of the plurality of functions a corresponding function weight. As explained above, a function weight can represent a level of quality of service associated with the function, and can be a value relative to the average latency of memory device 130.

At operation 430, the processing logic can select a function of the plurality of functions to service based on the corresponding function weight that is assigned to the function. In certain implementations, the function weight can be translated into a number of I/O operations that can be served from each function during an execution cycle, as explained above. At operation 440, the processing logic can assign a first operation weight to a first I/O operation type of the function and a second operation weight to a second I/O operation type of the first function. For example, the first I/O operation type can be a read type operation and the first operation weight can be a read weight. Similarly, the second I/O operation type can be a write type operation and the second operation weight can be a write weight.

At operation 450, the processing logic selects for execution a first number of operations of the first I/O operation type of the function, according to the first operation weight, and a second number of operations of the second I/O operation type of the first function according to the second operation weight. In implementations, the first number of operations can be selected from a first queue associated with the function, and the second number of operations can be selected from a second queue associated with the function, as explained in more details herein above.

Figure 5:
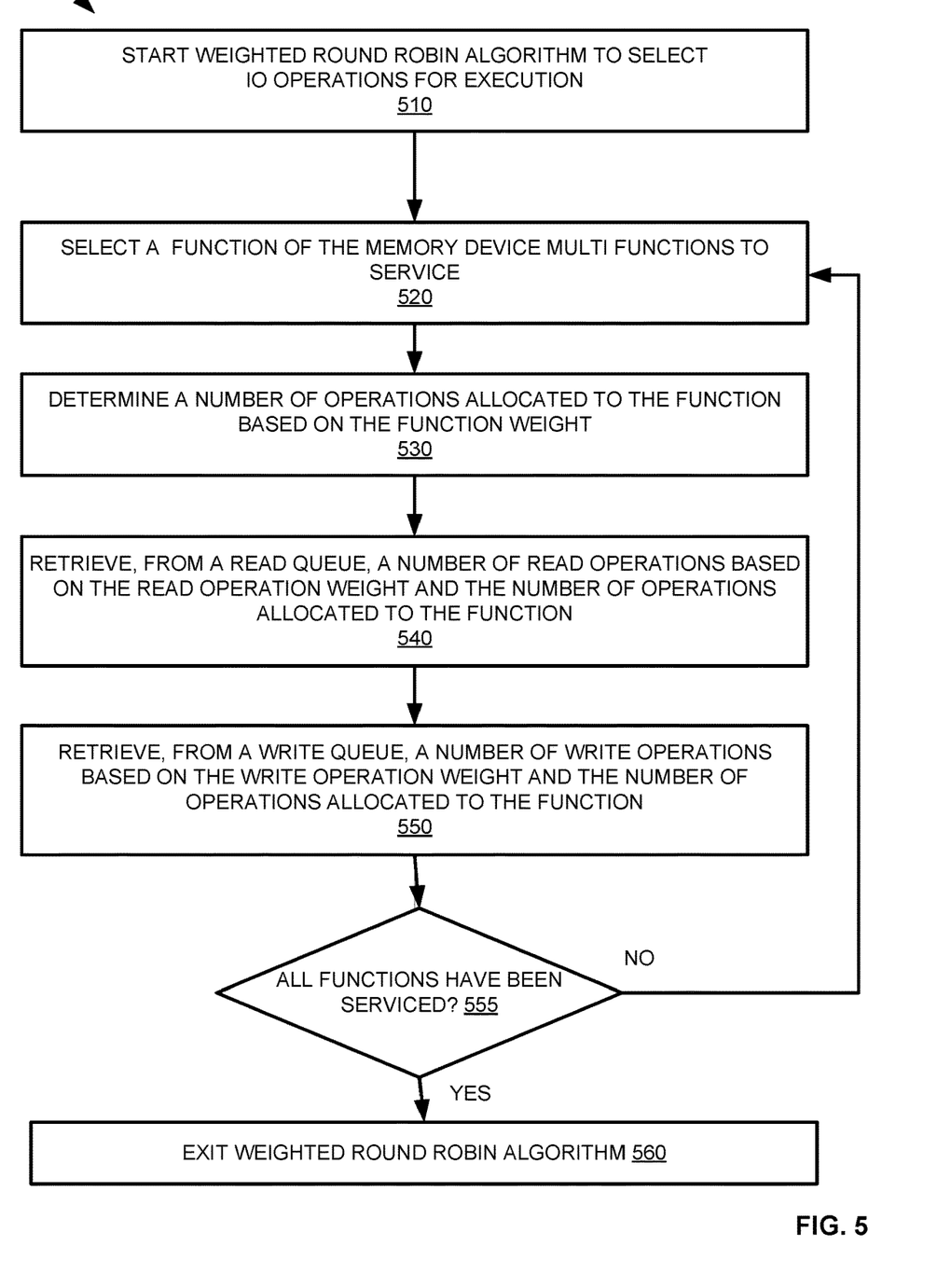
FIG. 5 is a flow diagram of an example method of an execution cycle of I/O operations supporting QoS levels management in a memory sub-system, in accordance with some embodiments of the present disclosure.

FIG. 5 is a flow diagram of an example method of an execution cycle of I/O operations supporting QoS levels management in a memory sub-system in accordance with some embodiments of the present disclosure. The method 500 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 500 is performed by QoS levels management module 113 of FIG. 1. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

At operation 510, the processing logic starts a weighted round robin selection scheme to select I/O operations for execution. Popular selection schemes include round robin and weighted round robin. In round robin selection, the memory sub-system visits each queue in order, executing a single command from that queue on each visit (although empty queues may be skipped). For example if there are two queues, the memory system may execute one command from the first queue, then one command from the second queue, then one command from the first queue again, and so on. With weighted round robin selection, one command queue may be allocated some greater amount of bandwidth than another command queue, such that a group of two or more commands may be executed each time the command queue with high weight is visited. For example, the memory system may execute five commands from the first queue before switching to the second queue, and then execute two commands from the second queue before switching back to the first queue.

At operation 520, the processing device selects a function of the memory device multi functions to service by executing I/O operations received at the function according to the function weight. In implementations, the function weight can be a value relative to the average latency of memory device 130, as explained in more details herein above. In certain implementations, function weight can be translated to a number of I/O operations of the function that can be executed in a given execution cycle. Thus, at operation 530, the processing logic determine the number of operations allocated to the function based on the function weight.

At operation 540, the processing logic can retrieve, from a read queue associated with the function, a number of read operations based on the read operation weight and the number of operations allocated to the function. At operation 550, the processing logic can retrieve, from a write queue associated with the function, a number of write operations based on the write operation weight and the number of operations allocated to the function. In certain implementations, the write operation weight can be a value relative to the average latency of the memory device (e.g. determined by the level of quality of service assigned to the write-type operations). Similarly, the read operation weight can be a value relative to the average latency of the memory device (e.g. determined by the level of quality of service assigned to the read-type operations).

In certain implementations, if the read queue does not contain I/O operations then the processing device can retrieve all I/O operations allocated to the function from the write queue for processing if available. Similarly, if the write queue does not contain I/O operations then the processing device can retrieve all I/O operations allocated to the function from the read queue for processing if available.

The processing logic continues to loop through each function of the multiple functions of the memory sub-system to execute I/O operations from each function according to the function weight of each. Thus, at operation 555, a decision is made as to whether all functions have been serviced. At operation 560, if all functions have been serviced, the processing logic can exit the weighted round robin algorithm as all I/O operations for the current execution cycle have been selected. If, on the other hand, the processing logic determines that some functions have not been services yet, the processing logic can loop back to operation 520 to select I/O operations received at the next function for execution.

Figure 6:
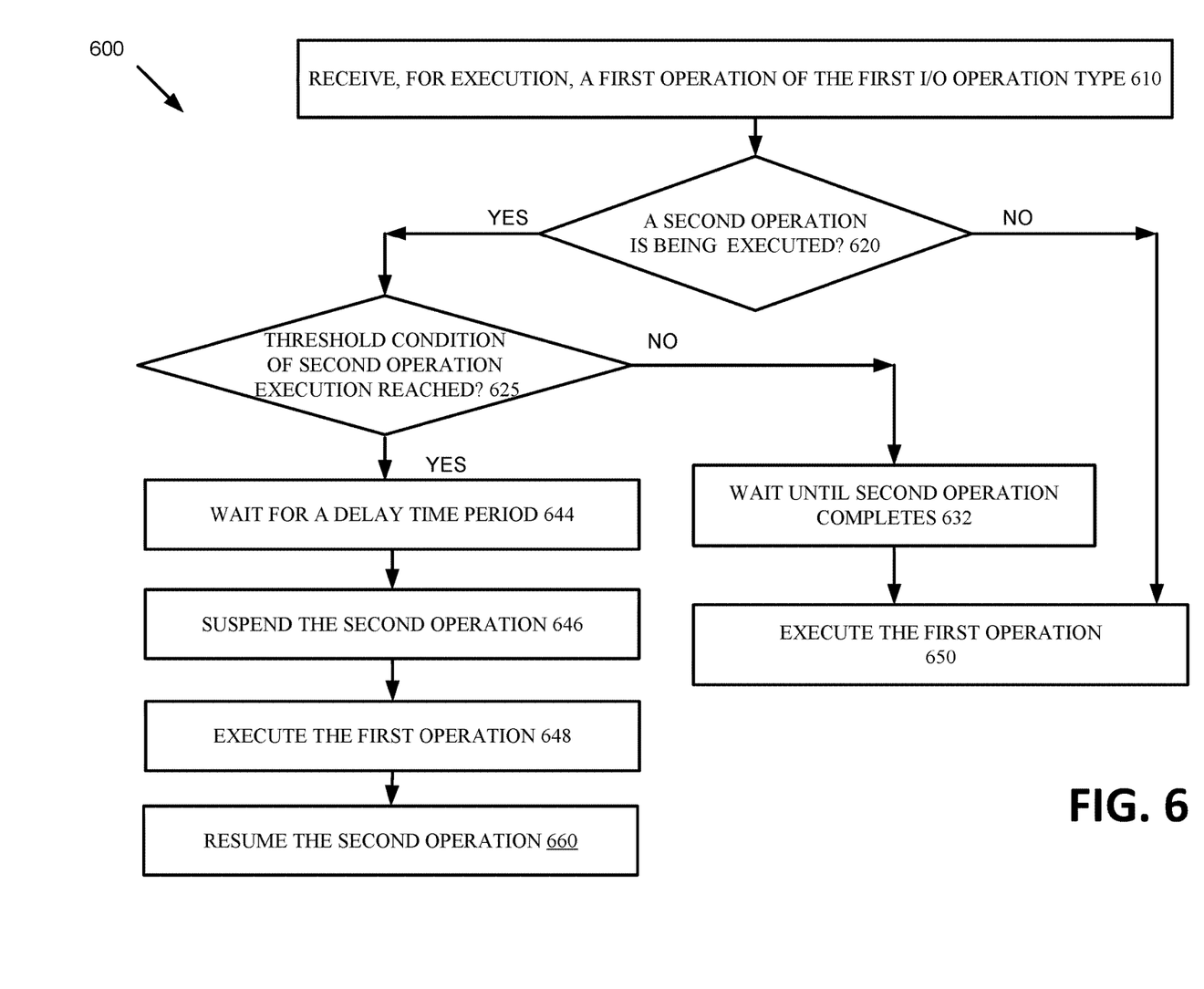
FIG. 6 is a flow diagram of an example method of a suspend and resume policy in support of QoS levels management in a memory sub-system, in accordance with some embodiments of the present disclosure.

FIG. 6 is a flow diagram of an example method of a suspend and resume policy in support of QoS levels management in a memory sub-system, in accordance with some embodiments of the present disclosure. The method 600 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 600 is performed by QoS levels management module 113 of FIG. 1. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

At operation 610, the processing logic receives, for execution at memory device 130, a first operation of the first I/O operation type. In implementations, the first operation type can be a read type operation. As explained above, the first type operation can have an assigned operation weight, indicating the priority of the operation. At operation 620, the processing logic determines whether a second operation of a second I/O operation type is being executed at memory device 130. The second I/O operation type can be a write type operation. The second type operation can have an assigned operation weight, indicating the priority of the operation.

If the processing logic determines that there is no I/O operation currently being process, the processing logic can execute the first I/O operation at operation 650. If, on the other hand, the processing logic determines that there is a second operation of the second I/O operation type being executed at memory device 130, the processing logic can evaluate a threshold condition at operation 625, in order to determine whether or not to suspend the second operation. In implementations, the processing logic can determine that if the second operation currently being executed has reached a percentage of execution below a certain threshold (e.g. less than 90% to completion), the processing logic can decide that the second operation should be suspended for the first operation to be executed. In other implementations, the processing logic can determine that the remaining execution time of the second operation is longer than the execution time of the first operation, the processing logic can decide that the second operation should be suspended.

At operation 644, the processing logic can determine that the second operation can be suspended, and can cause the first operation to wait for a delay time period before being executed. As explained above, the delay time period corresponds to the operation weight of the incoming first operation and the operation weight of the second operation in progress, such that the higher the ratio of the operation weight of the first operation to the operation weight of the second operation the longer the delay time period can be. The delay time period can be defined as increments of a predetermined period of time Tr (e. g. the average read time of memory device 130).

After the delay time period elapses, at operation 646, the processing logic can suspend the second operation in order to free memory device 130 for executing another operation. When the suspend operation completes, at operation 648, the processing logic can execute the first operation, by allowing the operation to access memory device 130. Subsequently, when the first operation completes, the processing logic can resume the suspended second operation at 660.

Figure 7:
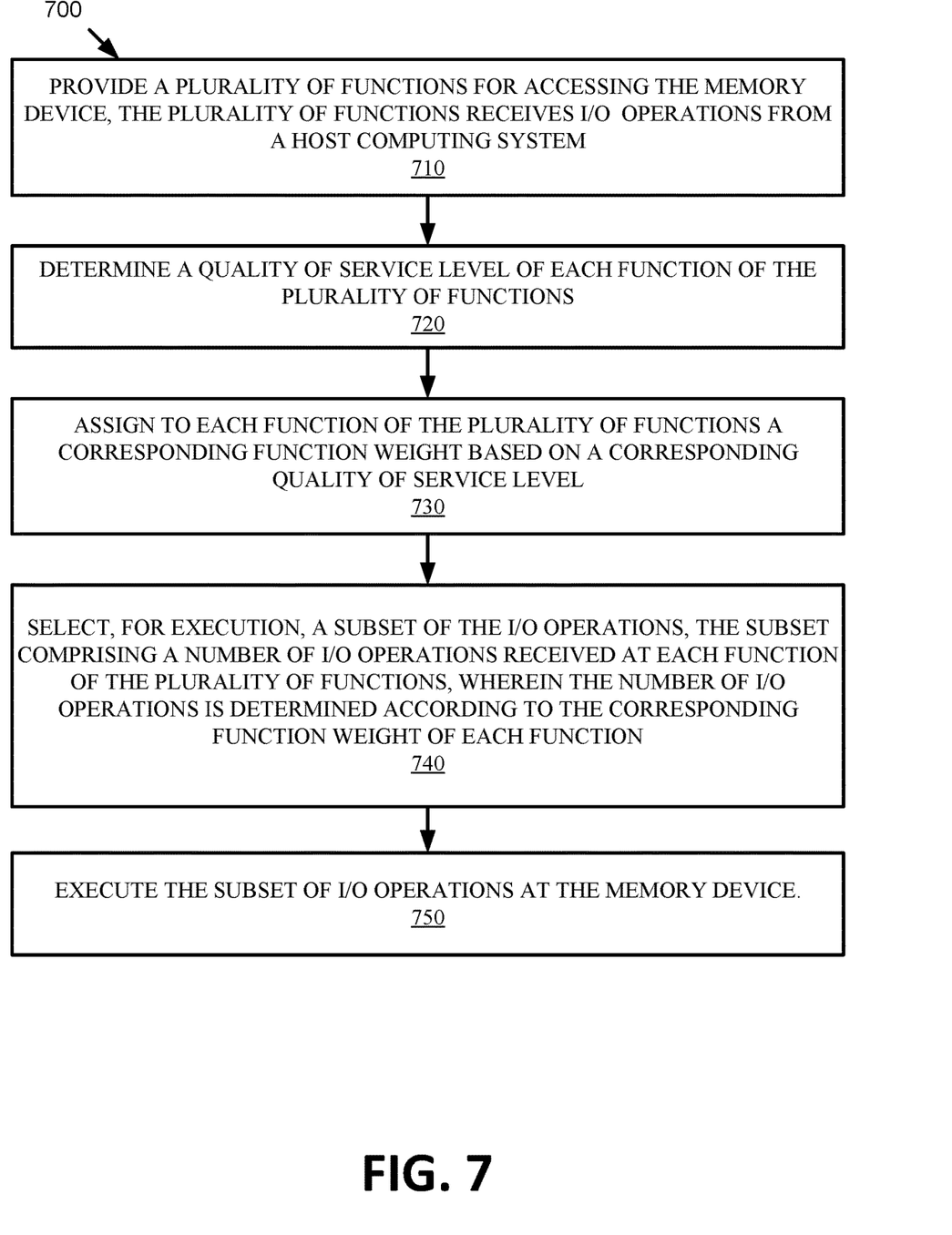
FIG. 7 is a flow diagram of an example method of assigning function weights in support of QoS levels management in a memory sub-system, in accordance with some embodiments of the present disclosure.

At operation 632, if the processing logic determines that the threshold condition has not been satisfied, the processing logic can decide that the second operation should be allowed to complete its execution. In one implementation, the threshold criterion can be that the execution of the second operation is less than 90% complete. In other implementations, the threshold criterion can be that the remaining execution time of the second operation is longer than the execution time of the first operation. The processing logic can then, cause the first operation to wait until the second operation executes completely. At operation 650, when the second operation completes its execution, the processing logic can execute the first operation. In this case, the suspend/resume policy has been avoided because the second operation was close to completion, thus interrupting it may not be beneficial to the overall system performance. FIG. 7 is a flow diagram of an example method of assigning function weights and in support of QoS levels management in a memory sub-system, in accordance with some embodiments of the present disclosure. The method 700 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 700 is performed by QoS levels management module 113 of FIG. 1. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

At operation 710, the processing logic provides a plurality of functions for accessing memory device 130. The plurality of function receives I/O operations from a host computing system for processing, as explained in more details herein above. The plurality of function can be virtual functions and/or physical functions that can receive read operations and write operations of the memory device 130. At operation 720, the processing logic can determine a quality of service level for each function of the plurality of functions. In implementations, the quality of service level of a function can determine the level of service that the function can receive so as to meet the conditions of service level agreement of the memory subsystem (e.g. quality, availability, responsibilities, etc. of the memory subsystem).

At operation 730, the processing logic can assign to each function of the plurality of functions a corresponding function weight. As explained above, a function weight can represent a level of quality of service associated with the function, and can be a value relative to the average latency of memory device 130.

At operation 740, the processing logic can select a set of I/O operations for execution at memory device 130. In implementations, the processing logic can select a subset of the I/O operations received at the functions of memory device 130, according to the function weight of each function. For example, the processing logic can select a number of I/O operations received at each function of the plurality of functions of memory device 130. The number of I/O operations selected at each function is determined according to the corresponding function weight of each function, so as to satisfy the quality of service level of each function, as explained in more details herein above.

Figure 8:
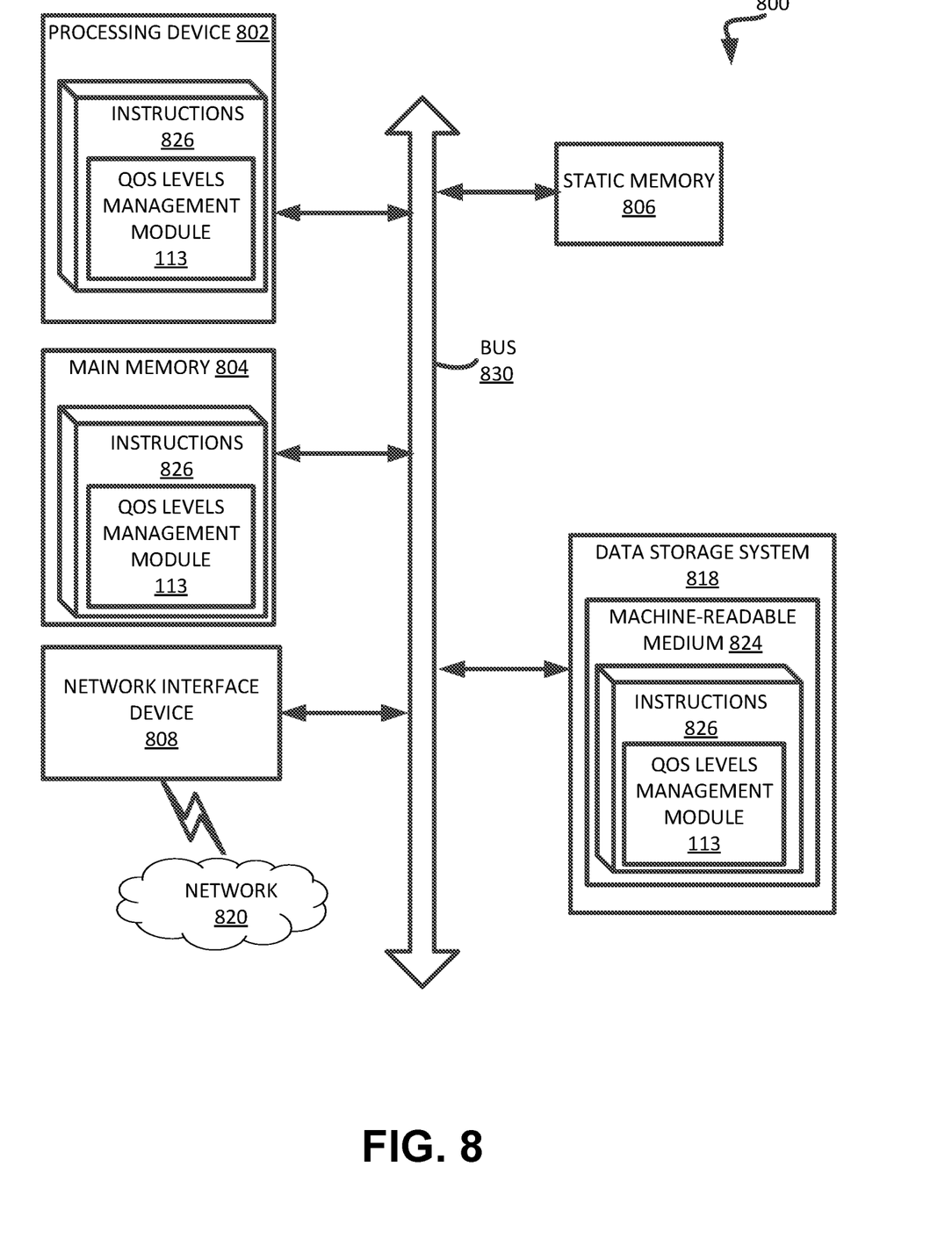
FIG. 8 is a block diagram of an example computer system in which embodiments of the present disclosure can operate.

At operation 750, the processing logic executes the selected subset of I/O operations at the next execution cycle of memory device 130, as explained in more details herein above. In certain implementations, the subset of I/O operations can be executed according to method 600 of FIG. 6. FIG. 8 illustrates an example machine of a computer system 800 within which a set of instructions, for causing the machine to perform any one or more of the methodologies discussed herein, can be executed. In some embodiments, the computer system 800 can correspond to a host system (e.g., the host system 120 of FIG. 1) that includes, is coupled to, or utilizes a memory sub-system (e.g., the memory sub-system 110 of FIG. 1) or can be used to perform the operations of a controller (e.g., to execute an operating system to perform operations corresponding to QoS levels management module 113 of FIG. 1). In alternative embodiments, the machine can be connected (e.g., networked) to other machines in a LAN, an intranet, an extranet, and/or the Internet. The machine can operate in the capacity of a server or a client machine in client-server network environment, as a peer machine in a peer-to-peer (or distributed) network environment, or as a server or a client machine in a cloud computing infrastructure or environment.

The machine can be a personal computer (PC), a tablet PC, a set-top box (STB), a Personal Digital Assistant (PDA), a cellular telephone, a web appliance, a server, a network router, a switch or bridge, or any machine capable of executing a set of instructions (sequential or otherwise) that specify actions to be taken by that machine. Further, while a single machine is illustrated, the term "machine" shall also be taken to include any collection of machines that individually or jointly execute a set (or multiple sets) of instructions to perform any one or more of the methodologies discussed herein.

The example computer system 800 includes a processing device 802, a main memory 804 (e.g., read-only memory (ROM), flash memory, dynamic random access memory (DRAM) such as synchronous DRAM (SDRAM) or Rambus DRAM (RDRAM), etc.), a static memory 806 (e.g., flash memory, static random access memory (SRAM), etc.), and a data storage system 818, which communicate with each other via a bus 830.

Processing device 802 represents one or more general-purpose processing devices such as a microprocessor, a central processing unit, or the like. More particularly, the processing device can be a complex instruction set computing (CISC) microprocessor, reduced instruction set computing (RISC) microprocessor, very long instruction word (VLIW) microprocessor, or a processor implementing other instruction sets, or processors implementing a combination of instruction sets. Processing device 802 can also be one or more special-purpose processing devices such as an application specific integrated circuit (ASIC), a field programmable gate array (FPGA), a digital signal processor (DSP), network processor, or the like. The processing device 802 is configured to execute instructions 826 for performing the operations and steps discussed herein. The computer system 800 can further include a network interface device 808 to communicate over the network 820.

The data storage system 818 can include a machine-readable storage medium 824 (also known as a computer-readable medium) on which is stored one or more sets of instructions 826 or software embodying any one or more of the methodologies or functions described herein. The instructions 826 can also reside, completely or at least partially, within the main memory 804 and/or within the processing device 802 during execution thereof by the computer system 800, the main memory 804 and the processing device 802 also constituting machine-readable storage media. The machine-readable storage medium 824, data storage system 818, and/or main memory 804 can correspond to the memory sub-system 110 of FIG. 1.

In one embodiment, the instructions 826 include instructions to implement functionality corresponding to QoS levels management module 113 of FIG. 1. While the machine-readable storage medium 824 is shown in an example embodiment to be a single medium, the term "machine-readable storage medium" should be taken to include a single medium or multiple media that store the one or more sets of instructions. The term "machine-readable storage medium" shall also be taken to include any medium that is capable of storing or encoding a set of instructions for execution by the machine and that cause the machine to perform any one or more of the methodologies of the present disclosure. The term "machine-readable storage medium" shall accordingly be taken to include, but not be limited to, solid-state memories, optical media, and magnetic media.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm is here, and generally, conceived to be a self-consistent sequence of operations leading to a desired result. The operations are those requiring physical manipulations of physical quantities. Usually, though not necessarily, these quantities take the form of electrical or magnetic signals capable of being stored, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. The present disclosure can refer to the action and processes of a computer system, or similar electronic computing device, that manipulates and transforms data represented as physical (electronic) quantities within the computer system's registers and memories into other data similarly represented as physical quantities within the computer system memories or registers or other such information storage systems.

The present disclosure also relates to an apparatus for performing the operations herein. This apparatus can be specially constructed for the intended purposes, or it can include a general purpose computer selectively activated or reconfigured by a computer program stored in the computer. Such a computer program can be stored in a computer readable storage medium, such as, but not limited to, any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, each coupled to a computer system bus.

The algorithms and displays presented herein are not inherently related to any particular computer or other apparatus. Various general purpose systems can be used with programs in accordance with the teachings herein, or it can prove convenient to construct a more specialized apparatus to perform the method. The structure for a variety of these systems will appear as set forth in the description below. In addition, the present disclosure is not described with reference to any particular programming language. It will be appreciated that a variety of programming languages can be used to implement the teachings of the disclosure as described herein.

The present disclosure can be provided as a computer program product, or software, that can include a machine-readable medium having stored thereon instructions, which can be used to program a computer system (or other electronic devices) to perform a process according to the present disclosure. A machine-readable medium includes any mechanism for storing information in a form readable by a machine (e.g., a computer). In some embodiments, a machine-readable (e.g., computer-readable) medium includes a machine (e.g., a computer) readable storage medium such as a read only memory ("ROM"), random access memory ("RAM"), magnetic disk storage media, optical storage media, flash memory components, etc.

In the foregoing specification, embodiments of the disclosure have been described with reference to specific example embodiments thereof. It will be evident that various modifications can be made thereto without departing from the broader spirit and scope of embodiments of the disclosure as set forth in the following claims. The specification and drawings are, accordingly, to be regarded in an illustrative sense rather than a restrictive sense.

What is claimed is:

1. A method comprising:
   receiving a request to execute a first operation of a first input/output (I/O) operation type at a memory device;
   determining whether a second operation of a second I/O operation type is being executed at the memory device; and
   responsive to determining that the second operation is being executed:
      causing the second operation to continue executing during a wait time period, wherein the wait time period is computed based on a predetermined time period modified to reflect a first operation weight of the first operation and a second operation weight of the second operation; and
      responsive to determining that the wait time period has elapsed:
         suspending the second operation;
         executing the first operation at the memory device; and
         responsive to determining that executing the first operation is complete, resuming execution of the second operation at the memory device.

2. The method of claim 1, wherein the first I/O operation type is a read operation and the second I/O operation type is a write operation.

3. The method of claim 1, wherein the first operation weight corresponds to a first level of quality of service associated with the first I/O operation type, and wherein the second operation weight corresponds to a second level of quality of service associated with the second I/O operation type.

4. The method of claim 3, wherein the first level of quality of service associated with the first I/O operation type comprises a first bandwidth dedicated to the first I/O operation type, and wherein the second level of quality of service associated with the second I/O operation type comprises a second bandwidth dedicated to the second I/O operation type.

5. The method of claim 1, wherein the wait period corresponds to one or more increments of an average read time of the memory device.

6. The method of claim 1, wherein determining that the second operation is being executed comprises:
 determining that a percentage of completed execution of the second operation currently being executed satisfies a threshold condition.

7. The method of claim 6, further comprising:
 responsive to determining that the percentage of completed execution of the second operation currently being executed does not satisfy the threshold condition:
  continuing to execute the second operation at the memory device; and
  responsive to determining that executing the second operation is complete, executing the first operation at the memory device.

8. A system comprising:
a memory device; and
a processing device, operatively coupled with the memory device, to:
 detect a first operation of a first input/output (I/O) operation type executing at a memory device;
 receive a request to execute a second operation of a second I/O operation type at the memory device;
 determine whether a percentage of execution time of the first operation satisfies a threshold condition; and
 responsive to determining that the percentage of execution time satisfies the threshold condition:
  continue to execute the first operation at the memory device; and
  responsive to determining that executing the first operation is complete, execute the second operation at the memory device.

9. The system of claim 8, wherein the processing device is further to:
 responsive to determining that the percentage of completed execution does not satisfy the threshold condition:
  suspend the first operation after a delay time period, wherein the delay time period corresponds to a first operation weight of the first operation and a second operation weight of the second operation;
  execute the second operation at the memory device; and
  responsive to determining that executing the second operation is complete, resume execution of the first operation at the memory device.

10. The system of claim 9, wherein the first operation weight corresponds to a first level of quality of service associated with the first I/O operation type, and wherein the second operation weight corresponds to a second level of quality of service associated with the second I/O operation type.

11. The system of claim 9, wherein the delay time period corresponds to one or more increments an average read time of the memory device.

12. The system of claim 8, wherein the first I/O operation type is a write operation and the second I/O operation type is a read operation.

13. The system of claim 8, wherein to determine that the percentage of execution time satisfies the threshold condition, the processing device is further to determine that a percentage of completed execution of the first I/O operation is larger than a predetermined percentage.

14. The system of claim 8, wherein to determine that the percentage of execution time satisfies the threshold condition, the processing device is further to determine that a percentage of remaining execution of the first I/O operation corresponds to a time period that is shorter than the execution time of the second operation.

15. A non-transitory computer-readable storage medium comprising instructions that, when executed by a processing device, cause the processing device to:
 receive a request to execute a first operation of a first input/output (I/O) operation type at a memory device;
 determine whether a second operation of a second I/O operation type is being executed at the memory device; and
 responsive to determining that the second operation is being executed:
  cause the second operation to continue executing during a wait time period, wherein the wait time period is computed based on a predetermined time period modified to reflect a first operation weight of the first operation and a second operation weight of the second operation; and
  responsive to determining that the wait time period has elapsed:
   suspend the second operation execute the first operation at the memory device; and
   responsive to determining that executing the first operation is complete, resume execution of the second operation at the memory device.

16. The non-transitory computer-readable storage medium of claim 15, wherein the first I/O operation type is a read operation and the second I/O operation type is a write operation.

17. The non-transitory computer-readable storage medium of claim 15, wherein the first operation weight corresponds to a first level of quality of service associated with the first I/O operation type, and wherein the second operation weight corresponds to a second level of quality of service associated with the second I/O operation type.

18. The non-transitory computer-readable storage medium of claim 17, wherein the first level of quality of service associated with the first I/O operation type comprises a first bandwidth dedicated to the first I/O operation type, and wherein the second level of quality of service associated with the second I/O operation type comprises a second bandwidth dedicated to the second I/O operation type.

19. The non-transitory computer-readable storage medium of claim 15, wherein to determine that the second operation is being executed, the processing device is further to:
 determine that a percentage of completed execution of the second operation currently being executed satisfies a threshold condition.

20. The non-transitory computer-readable storage medium of claim 15, wherein the processing device is further to:

responsive to determining that the percentage of completed execution of the second operation currently being executed does not satisfy the threshold condition: continue to execute the second operation at the memory device; and responsive to determining that executing the second operation is complete, execute the first operation at the memory device.

\* \* \* \* \*